(12) United States Patent
Chen

(10) Patent No.: US 7,812,912 B2
(45) Date of Patent: Oct. 12, 2010

(54) DISPLAY PANEL WITH PINS ARRANGEMENT

(75) Inventor: Yung-Chien Chen, Taoyuan County (TW)

(73) Assignee: Chungwa Picture Tubes, Ltd., Taoyuan (TW)

(*) Notice: Subject to any disclaimer, the term of this patent is extended or adjusted under 35 U.S.C. 154(b) by 454 days.

(21) Appl. No.: 11/828,346

(22) Filed: Jul. 25, 2007

(65) Prior Publication Data

US 2008/0218057 A1 Sep. 11, 2008

(30) Foreign Application Priority Data

Mar. 8, 2007 (TW) ............... 96107982 A

(51) Int. Cl.
 G02F 1/1345 (2006.01)
 G09G 3/36 (2006.01)
(52) U.S. Cl. .......... 349/149; 349/150; 349/151; 349/152; 345/104
(58) Field of Classification Search ......... 349/149–152; 345/104
See application file for complete search history.

(56) References Cited

U.S. PATENT DOCUMENTS 5,757,450 A * 5/1998 Fujii et al. ............ 349/106
5,825,450 A * 10/1998 Date et al. ............ 349/149
5,982,470 A * 11/1999 Nakahara et al. ...... 349/153
6,853,428 B2 2/2005 Han et al.
2001/0015709 A1* 8/2001 Imajo et al. ............ 345/87

FOREIGN PATENT DOCUMENTS

| | | |
|---|---|---|
| CN | 1553430 | 12/2004 |
| CN | 1896808 | 1/2007 |
| JP | 2000-312070 | 11/2000 |

OTHER PUBLICATIONS

"1st Office Action of China counterpart application", issued on Jun. 5, 2009, p. 1-p. 6.

* cited by examiner

Primary Examiner—Hoan C Nguyen
(74) Attorney, Agent, or Firm—Jianq Chyun IP Office

(57) ABSTRACT

A display panel including a substrate and many driving chips is provided. The substrate has many pad regions located in a non-display region of the substrate. Each pad region has many first pins with the same length disposed therein, and a pin pitch between two adjacent first pins, a width of each of the first pins, or both the pin pitch and the width vary with the positions where the first pins are disposed in the corresponding pad region. The driving chips are disposed in the non-display region of the substrate. Each driving chip has many second pins, and each second pin is electrically connected to each first pin correspondingly.

5 Claims, 12 Drawing Sheets

DISPLAY PANEL WITH PINS ARRANGEMENT

CROSS-REFERENCE TO RELATED APPLICATION

This application claims the priority benefit of Taiwan application serial no. 96107982, filed Mar. 8, 2007. All disclosure of the Taiwan application is incorporated herein by reference.

BACKGROUND OF THE INVENTION

1. Field of the Invention

The present invention relates to a display panel, and more particularly relates to a display panel in which pins of a chip can be accurately bonded to pins of a substrate.

2. Description of Related Art

With prominent display quality and low costs, cathode ray tube (CRT) displays have dominated the display market in recent years. However, the CRT display not only produces hazardous radiation but also occupies a large space. Recently, thanks to rapid development in the semiconductor devices, planar displays having the advantages of high definition, great space utilization efficiency, low power consumption and non-radiation have become the mainstream products in the display market.

The planar display is consisted of a display panel, a light source for providing sufficient luminance to the display panel, and driving chips disposed on a substrate of the display panel. The driving chips are employed to drive circuits within the display panel, such that the display panel is capable of displaying images.

FIG. 1A is a schematic view of a conventional display panel, while FIG. 1B is an enlarged partial view of FIG. 1A. Referring to FIG. 1, a plurality of pad regions 120 is disposed in a non-display region 110a of a substrate 110 in a display panel 100, and a plurality of pins 122 is disposed in each of the pad regions 120. The pins 122 are electrically connected to pins 132 of driving chips 130.

However, due to material properties of the pins 122 and 132, when the pins 132 of the driving chips 130 and the pins 122 in each of the pad regions 120 are bonded through implementing a thermal compression process, the pins 122 may encounter quality issues related to shape deformation, positional deviation, etc. According to different positions where the pins 122 are disposed in the pad region 120. All the issues result in imperfect bonding of the pins 132 of the driving chips 130 to the pins 122 in each of the pad regions 120. As a bonding rate of the pins 132 of the driving chips 130 to the pins 122 on the substrate 110 is rather low, the display quality of the display panel 100 is then greatly impaired.

SUMMARY OF THE INVENTION

The present invention is directed to a display panel having driving chips disposed thereon. The driving chips have pins which can be accurately bonded to the pins on the display panel.

The present invention provides a display panel including a substrate and a plurality of driving chips. The substrate has a plurality of pad regions located in a non-display region of the substrate, and a plurality of first pins with the same length is disposed in each of the pad regions. A pin pitch between the two adjacent first pins, a width of each of the first pins, or both said pin pitch and said width vary with different positions where the first pins are disposed in a corresponding pad region. The driving chips are disposed in the non-display region of the substrate. Here, each of the driving chips has a plurality of second pins, and each second pin is electrically connected to each first pin correspondingly.

According to one embodiment of the present invention, each pad region has a center line, and the first pins in each of the pad regions are symmetrically arranged with respect to the center line.

According to one embodiment of the present invention, the pin pitch between the two adjacent first pins in each of the pad regions is increased in a direction away from the center line.

According to one embodiment of the present invention, the width of each of the first pins in each of the pad regions is increased in the direction away from the center line.

According to one embodiment of the present invention, each of the pad regions includes a non expansion region and two expansion regions at two sides of the non expansion region.

According to one embodiment of the present invention, each pin pitch between the two adjacent first pins in the non expansion region is the same.

According to one embodiment of the present invention, the pin pitch between the two adjacent first pins in the expansion region is increased in a direction away from the adjoining non expansion region.

According to one embodiment of the present invention, the width of each of the first pins in the expansion region is increased in the direction away from the adjoining non expansion region.

According to one embodiment of the present invention, the width of each of the first pins in the non expansion region is the same.

According to one embodiment of the present invention, the pin pitch between the two adjacent first pins in the expansion region is increased in the direction away from the adjoining non expansion region.

According to one embodiment of the present invention, the width of each of the first pins in the expansion region is increased in the direction away from the adjoining non expansion region.

According to one embodiment of the present invention, each pin pitch between the two adjacent first pins in the expansion region is the same.

According to one embodiment of the present invention, the pin pitch between the two adjacent first pins in the non expansion region is increased in a direction away from the adjoining expansion region.

According to one embodiment of the present invention, the width of each of the first pins in the non expansion region is increased in the direction away from the adjoining expansion region.

According to one embodiment of the present invention, the width of each of the first pins in the expansion region is the same.

According to one embodiment of the present invention, the pin pitch between the two adjacent first pins in the non expansion region is increased in the direction away from the adjoining expansion region.

According to one embodiment of the present invention, the width of each of the first pins in the non expansion region is increased in the direction away from the adjoining expansion region.

According to one embodiment of the present invention, the substrate is an active device array substrate.

In the display panel provided by the present invention, the width of each of the first pins, the pin pitch between the two first pins, or both said width and said pin pitch may vary with different positions where the first pins are disposed in one of the pad regions. Thus, after a thermal compression process is performed to bond the driving chips to the substrate, the first pins and the second pins can be bonded at a better bonding rate than the bonding rate disclosed in the related art, and yield of the display panel can be improved as well.

In order to make the aforementioned and other objects, features and advantages of the present invention more comprehensible, several embodiments accompanied with figures are described in detail below.

DESCRIPTION OF EMBODIMENTS

First Embodiment

Figure 1A:
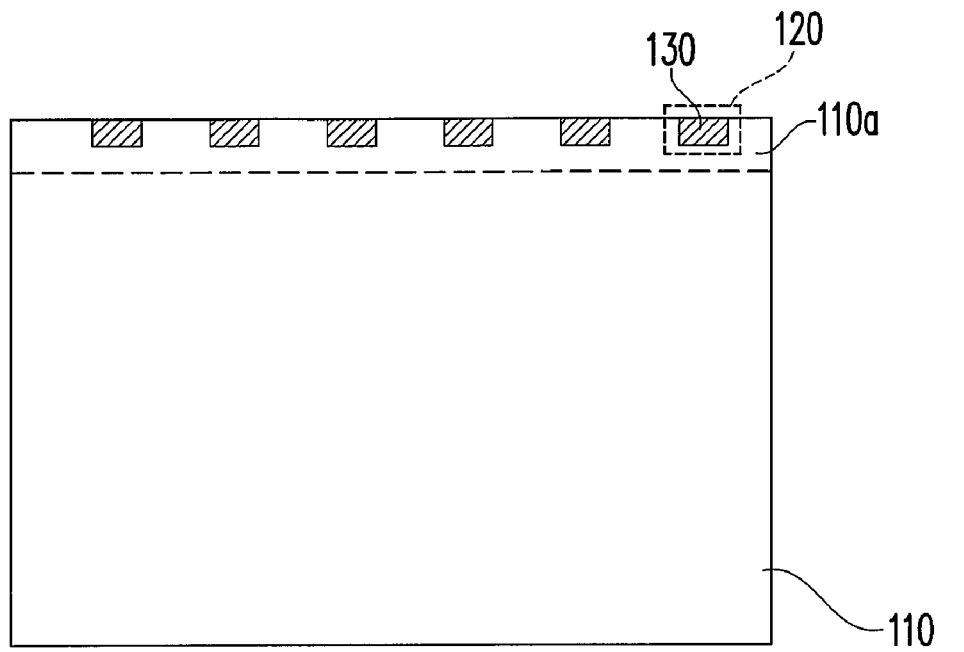
FIG. 1A is a schematic view of a conventional display panel.
Figure 1B:
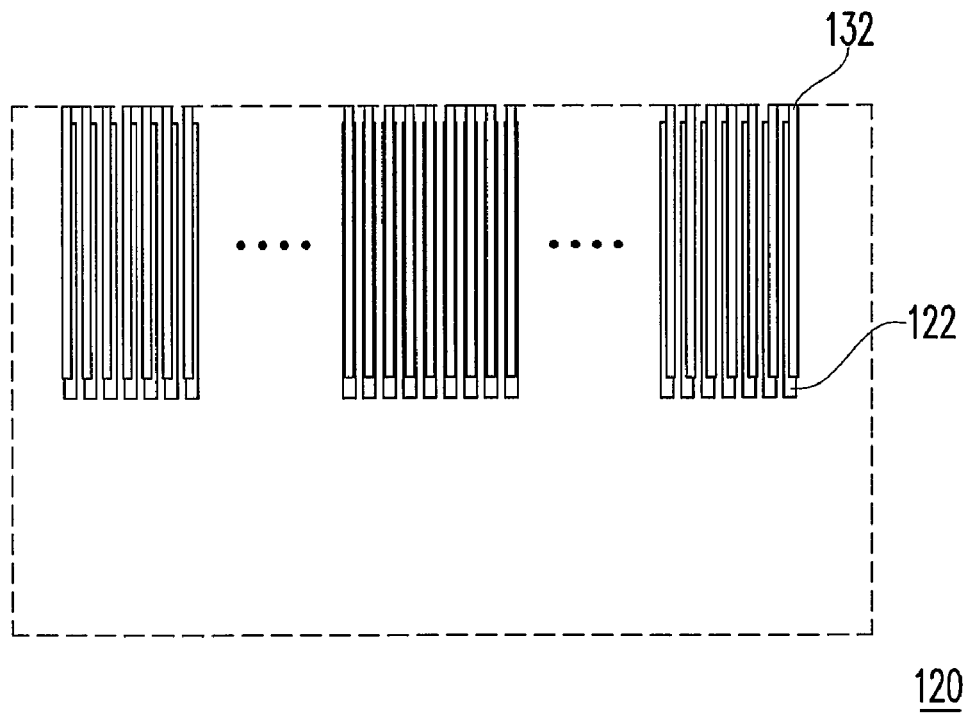
FIG. 1B is an enlarged partial view of FIG. 1A.
Figure 2A:
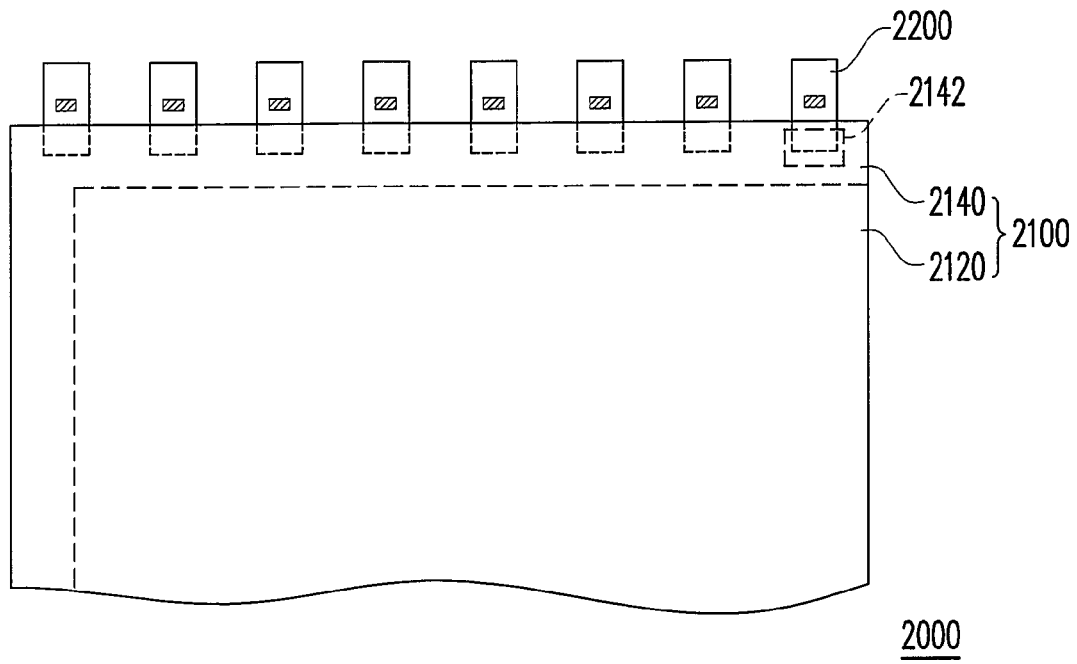
FIG. 2A is a schematic view of a display panel according to a first embodiment of the present invention.
Figure 2B:
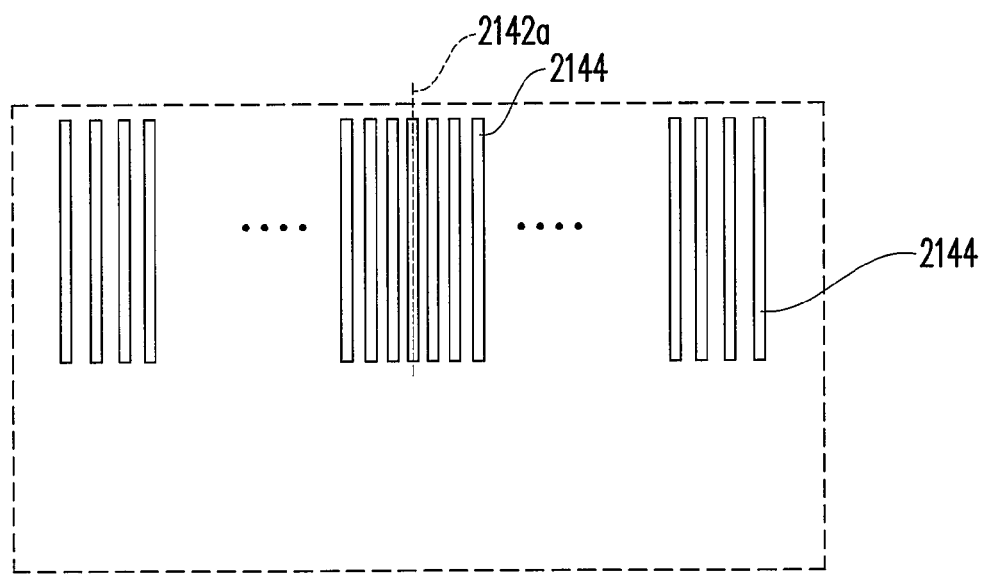
FIG. 2B is an enlarged partial view of a substrate of the display panel depicted in FIG. 2A.

FIG. 2A is a schematic view of a display panel according to a first embodiment of the present invention, while FIG. 2B is an enlarged partial view of a substrate of the display panel depicted in FIG. 2A. Referring to FIGS. 2A and 2B together, a display panel 2000 of the present embodiment includes a substrate 2100 and a plurality of driving chips 2200. The substrate 2100 of the present embodiment is an active device array substrate, and the substrate 2100 has a display region 2120 and a non-display region 2140 surrounding the display region 2120. A plurality of pad regions 2142 is disposed in the non-display region 2140, and each of the pad regions 2142 has a center line 2142a. In addition, a plurality of first pins 2144 with the same length is disposed in each of the pad regions 2142, and the first pins 2144 are symmetrically arranged with respect to the center line 2142a in the pad region 2144 in parallel.

It should be noted that a pin pitch between the two adjacent first pins 2144 in each of the pad regions 2142 of the display panel 2000 may vary with different positions where the first pins 2144 are disposed in one of the pad regions 2142. More particularly, the pin pitch between the two adjacent first pins 2144 may be increased in a direction away from the center line 2142a.

Figure 2C:
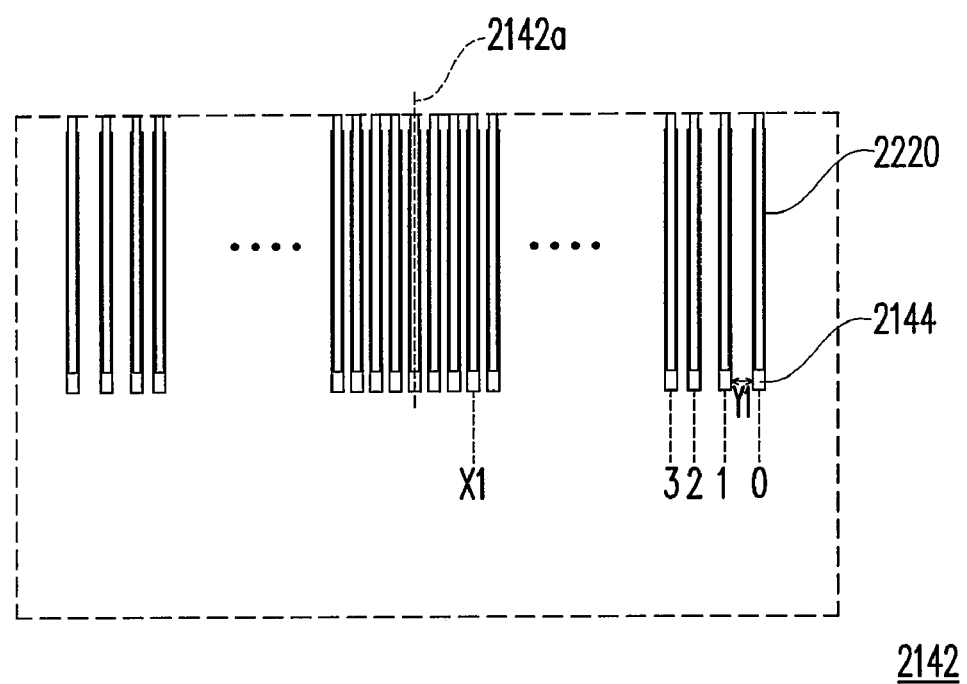
FIG. 2C is a schematic view depicting a bonding of first pins of a substrate to second pins of driving chips in a pad region.

FIG. 2C is a schematic view depicting a bonding of the first pins of the substrate to second pins of driving chips in the pad region. A plurality of driving chips 2200 is disposed in the non-display region 2140. Each of the driving chips 2200 has a plurality of second pins 2220, and each second pin 2220 is electrically connected to each first pin 2144.

As the driving chips 2200 are disposed on the substrate 2100 through performing a thermal compression process, the second pins 2220 of the driving chips 2200 are electrically connected to the first pins 2144 in one of the pad regions 2142. However, during the thermal compression process, the first pins 2144 and the second pins 2220 are easily expanded by heat due to material properties of the first pins 2144 and the second pins 2220.

It should be noted that an arrangement of the pin pitch between the two adjacent first pins 2144 can be calculated and obtained through an $N^{th}$ degree equation with one unknown as follows. $Y=aX^n+bX^1+c$. Here, X refers to an input, Y denotes an output, and a, b and c are constants. On the other hand, bounding conditions (B.Cs.) are provided hereinafter.

B.C.1:
　　$X=$ the $0^{th}$ first pin
　　$Y=$ pin pitch $=Y1$
B.C.2:
　　$X=$ the $X1^{th}$ first pin
　　$Y=$ pin pitch $=Y2$
B.C.3:
　　$Y'(0)=0$ The above B.Cs are substituted into the equation, and an effective equation $Y=(Y2-Y1)*(X/X1)^n+Y1$ is obtained.

By substituting the $X1^{th}$ first pin 2144 into said effective equation, it can be deduced that the pin pitch between the two adjacent first pins 2144 is increased in a direction away from the center line 2142a. Besides, the thermal expansion results in the imperfect bonding of the first pins 2144 to the second pins 2220. Since the pin pitch between the two adjacent first pins 2144 is increased in the direction away from the center line 2142a, the imperfect bonding can then be improved, so as to increase the bonding rate of the first pins 2144 to the second pins 2220 after the thermal compression process is carried out.

In comparison with the related art, the high bonding rate of the first pins 2144 to the second pins 2220 in the present embodiment leads to a saving in reworking material costs arisen from the imperfect bonding of the first pins 2144 to the second pins 2220, and rework labor hours can also be reduced, simultaneously increasing yield of the display panel 2000.

People in this field should be able to develop a better modeling of the equation or favorably adjust the B.Cs. After the embodiments and the claims of the present invention are studied, a better modeling of the equation may be developed and the corresponding B.C. may be revised based on actual manufacturing process and demands. For example, Y may also be the width of the first pins 2144. A theory provided by the following embodiments is similar to the concept of the present invention. In other words, the $N^{th}$ degree equation with one unknown can be used to establish the effective equations for each of the following embodiments, and thus no further description will be provided hereinafter.

Second Embodiment

The present embodiment is approximately identical to the first embodiment, and same or similar reference numbers used in the present embodiment and in the first embodiment represent the same or the like elements. Accordingly, no further description thereof is provided hereinafter. On the other hand, the difference between the present embodiment and the first embodiment will be demonstrated as follows.

Figure 3:
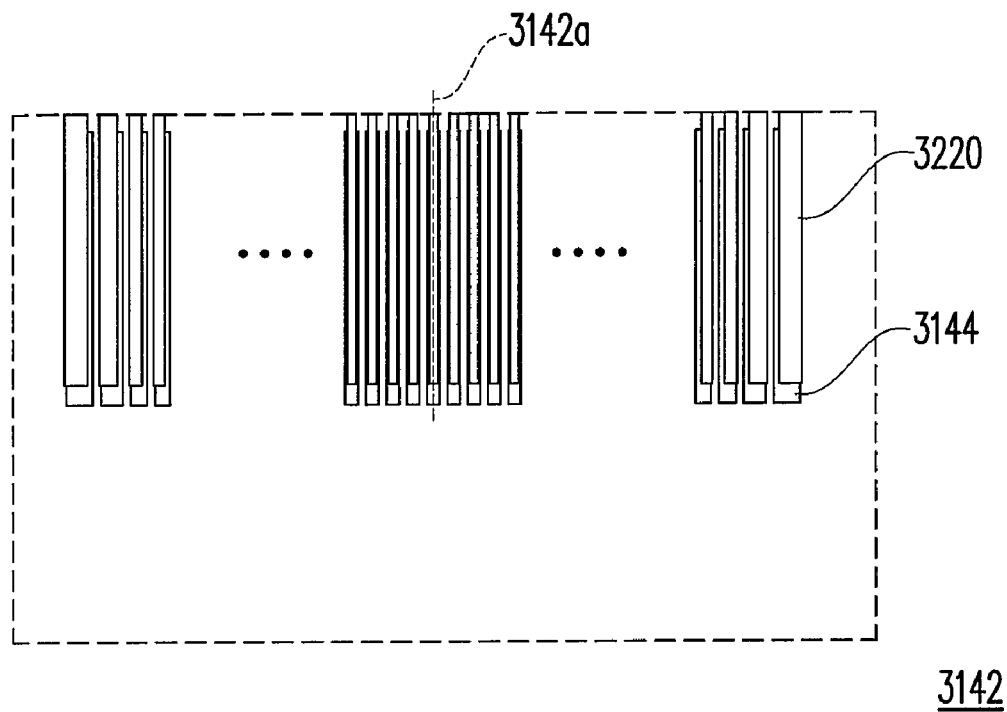
FIG. 3 is a schematic view depicting a bonding of first pins of a substrate to second pins of driving chips in a display panel according to a second embodiment of the present invention.

FIG. 3 is a schematic view depicting a bonding of first pins of a substrate to second pins of driving chips in a display panel according to a second embodiment of the present invention. Referring to FIG. 3, the difference between the present embodiment and the first embodiment lies in that a width of each of first pins 3144 in each of pad regions 3142 in a display panel of the present embodiment (not shown) may vary with different positions where the first pins 3144 are disposed in the corresponding pad region 3142. Particularly, the first pins 3144 are arranged with respect to a center line 3142a of the pad region 3142, and the width of each of the first pins 3144 is increased in a direction away from the center line 3142a.

Thereby, with the increase in the width of each of the first pins 3144 in the pad region 3142 in the direction away from the center line 3142a, the imperfect bonding which is caused by a thermal expansion and occurs between the first pins 3144 and second pins 3220 can be improved after a thermal compression process is performed.

In comparison with the related art, the high bonding rate of the first pins 3144 to the second pins 3220 in the present embodiment leads to a saving in reworking material costs arisen from the imperfect bonding of the first pins 3144 to the second pins 3220, and rework labor hours can also be reduced, simultaneously increasing yield of the display panel (not shown).

Third Embodiment

Figure 4:
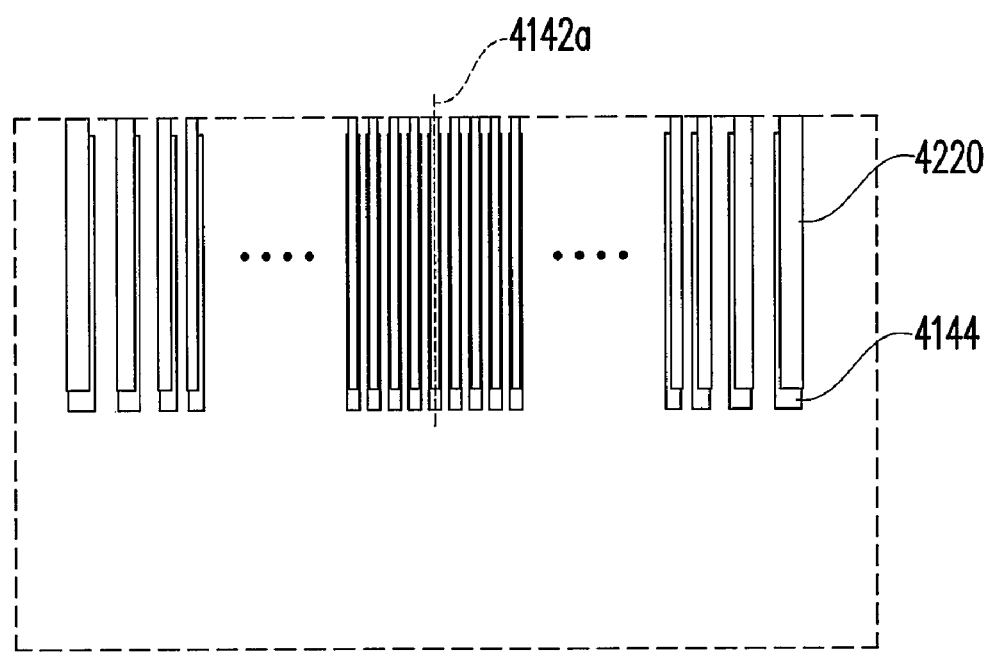
FIG. 4 is a schematic view depicting a bonding of first pins of a substrate to second pins of driving chips in a display panel according to a third embodiment of the present invention.

The present embodiment is approximately identical to the first and the second embodiments, and same or similar reference numbers used in the present embodiment and in the first and the second embodiments represent the same or the like elements. Accordingly, no further description thereof is provided hereinafter. FIG. 4 is a schematic view depicting a bonding of first pins of a substrate to second pins of driving chips in a display panel according to a third embodiment of the present invention. Referring to FIG. 4, the difference between the present embodiment and the first and the second embodiments lies in that both a pin pitch between two adjacent first pins 4144 in each of pad regions 4142 in a display panel (not shown) and a width of each of the first pins 4144 may vary with different positions where the first pins 4144 are disposed in the corresponding pad region 4142. Particularly, the first pins 4144 are arranged with respect to a center line 4142a of the pad region 4142, and the width of each of the first pins 4144 and the pin pitch between the two adjacent first pins 4144 are both increased in a direction away from the center line 4142a.

Thus, the imperfect bonding which is caused by a thermal expansion and occurs between the first pins 4144 and second pins 4220 according to the related art can be improved after a thermal compression process is performed, increasing the bonding rate of the first pins 4144 to the second pins 4220. Accordingly, reworking material costs arisen from the imperfect bonding of the first pins 4144 to the second pins 4220 can be saved, and rework labor hours can also be decreased, simultaneously increasing yield of the display panel (not shown).

Besides, with the increase in the width of each of the first pins 4144 and in the pin pitch between the two adjacent first pins 4144 in the direction away from the center line 4142a, the display panel of the present embodiment gives a better yield than the display panels of the first and the second embodiments.

Fourth Embodiment

Figure 5A:
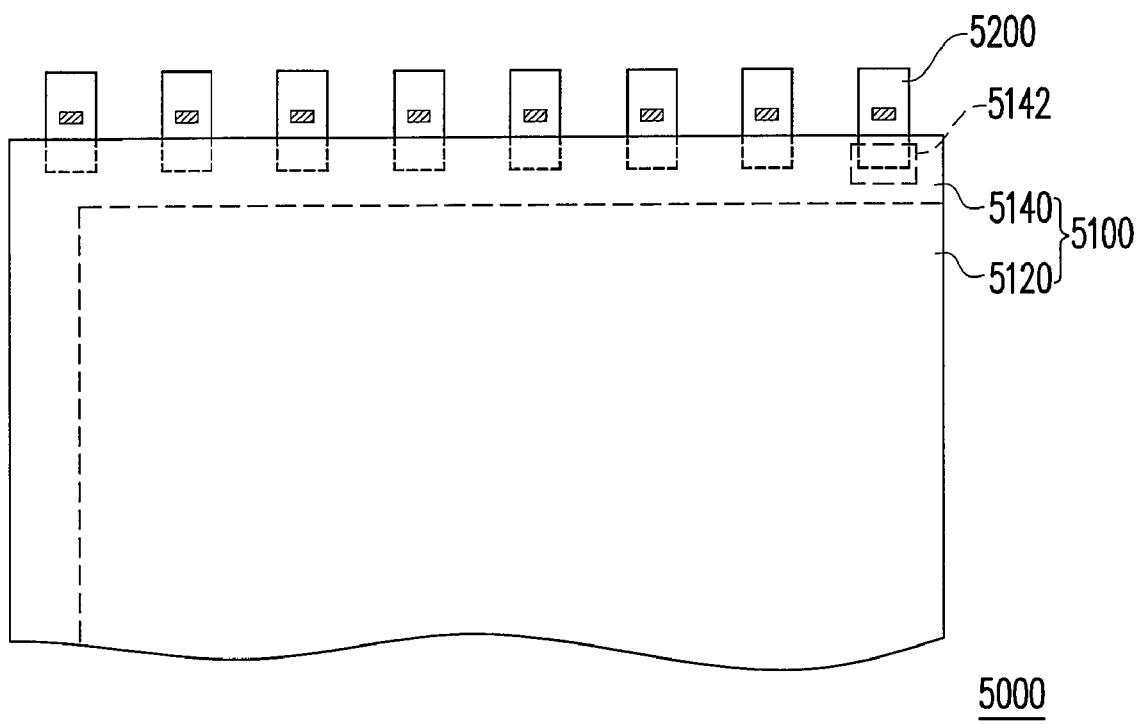
FIG. 5A is a schematic view of a display panel according to a fourth embodiment of the present invention.
Figure 5B:
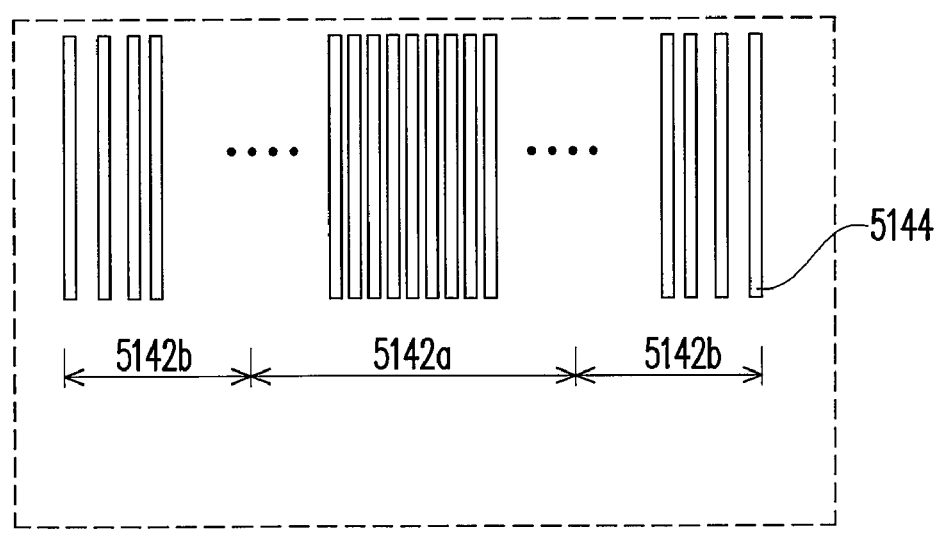
FIG. 5B is an enlarged partial view of a substrate of the display panel depicted in FIG. 5A.
Figure 5C:
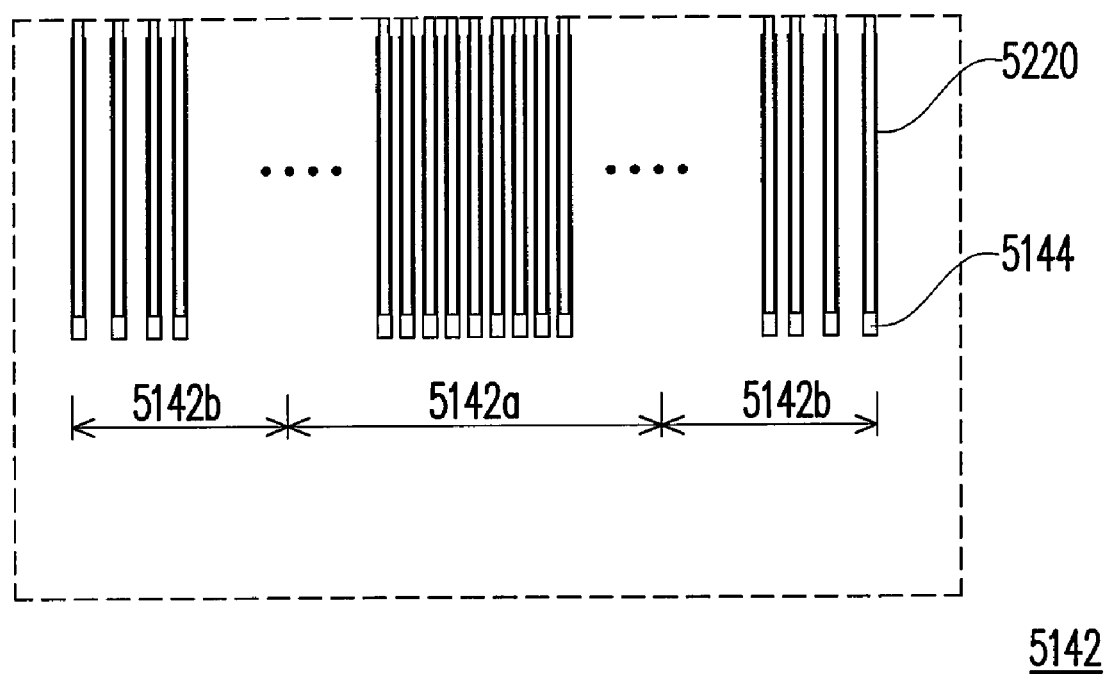
FIG. 5C is a schematic view depicting a bonding of first pins of a substrate to second pins of driving chips in a pad region.

The present embodiment is approximately identical to the first embodiment, and same or similar reference numbers used in the present embodiment and in the first embodiment represent the same or the like elements. Accordingly, no further description thereof is provided hereinafter. FIG. 5A is a schematic view of a display panel according to a fourth embodiment of the present invention. FIG. 5B is an enlarged partial view of a substrate of the display panel depicted in FIG. 5A. FIG. 5C is a schematic view depicting a bonding of first pins of a substrate to second pins of driving chips in a pad region. Referring to FIGS. 5A, 5B and 5C together, a display panel 5000 of the present embodiment includes a substrate 5100 and a plurality of driving chips 5200. The substrate 5100 has a display region 5120 and a non-display region 5140 surrounding the display region 5120. A plurality of pad regions 5142 is disposed in the non-display region 5140, and each of the pad regions 5142 can be further divided into a non expansion region 5142a and two expansion regions 5142b at two sides of the non expansion region 5142a. In addition, the first pins 5144 in each of the pad regions 5142 have the same length and width, and the first pins 5144 are arranged in parallel.

It should be noted that each pin pitch between the two adjacent first pins 5144 in the non expansion region 5142a is the same, while the pin pitch between the two adjacent first pins 5144 in the expansion regions 5142b may vary with different positions where the first pins 5144 are disposed relative to the non expansion region 5142a.

More particularly, as the first pins 5144 are relatively disposed in a farther distance from the non expansion region 5142a, the pin pitch between the two adjacent first pins 5144 in the expansion regions 5142b is increased.

Moreover, a plurality of driving chips 5200 is disposed in the non-display region 5140. Each of the driving chips 5200 has a plurality of second pins 5220, and each second pin 5220 is electrically connected to each first pin 5144.

Referring to FIG. 5B, when the driving chips 5200 are disposed on the substrate 5100 through performing a thermal compression process, the second pins 5220 of the driving chips 5200 are electrically connected to the first pins 5144 in one of the pad regions 5142. However, during the thermal compression process, the first pins 5144 and the second pins 5220 are easily expanded by heat due to the material properties of the first pins 5144 and the second pins 5220.

It should be noted that the pin pitch between the two adjacent first pins 5144 in the expansion regions 5142b is increased when the first pins 5144 are relatively disposed in a farther distance from the non expansion region 5142a. Thus, the imperfect bonding which is caused by a thermal expansion and occurs between the first pins 5144 and the second pins 5220 can be improved after a thermal compression process is performed, increasing the bonding rate of the first pins 5144 to the second pins 5220.

In comparison with the related art, the high bonding rate of the first pins 5144 to the second pins 5220 in the present embodiment leads to a saving in reworking material costs arisen from the imperfect bonding of the first pins 5144 to the second pins 5220, and rework labor hours can also be reduced, simultaneously increasing yield of the display panel 5000.

Fifth Embodiment

Figure 6:
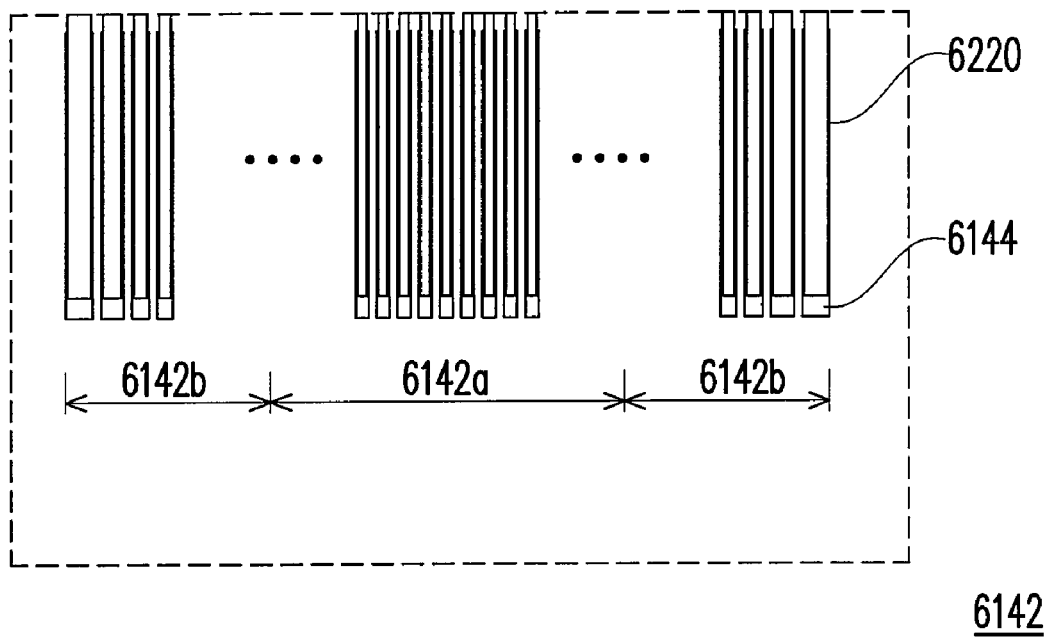
FIG. 6 is a schematic view of a display panel according to a fifth embodiment of the present invention.

The present embodiment is approximately identical to the fourth embodiment, and same or similar reference numbers used in the present embodiment and in the fourth embodiment represent the same or the like elements. Accordingly, no further description thereof is provided hereinafter. FIG. 6 is a schematic view depicting a bonding of first pins of a substrate to second pins of driving chips in a display panel according to a fifth embodiment of the present invention. Referring to FIG. 6, the difference between the present embodiment and the fourth embodiment lies in that a width of each of the first pins 6144 in expansion regions 6142b may vary with different positions where the first pins 6144 are disposed relative to a non expansion region 6142a.

More particularly, as the first pins 6144 are relatively disposed in a farther distance from the non expansion region 6142a, the width of each of the first pins 6144 in the expansion regions 6142b is increased.

Thus, as second pins 6220 are electrically connected to the first pins 6144 through performing a thermal compression process, the imperfect bonding which is caused by a thermal expansion and occurs between the first pins 6144 and the second pins 6220 can be improved after a thermal compression process is performed, increasing the bonding rate of the first pins 6144 to the second pins 6220.

In comparison with the related art, the high bonding rate of the first pins 6144 to the second pins 6220 in the present embodiment leads to a saving in reworking material costs arisen from the imperfect bonding of the first pins 6144 to the second pins 6220, and rework labor hours can also be reduced, simultaneously increasing yield of the display panel (not shown).

Sixth Embodiment

Figure 7:
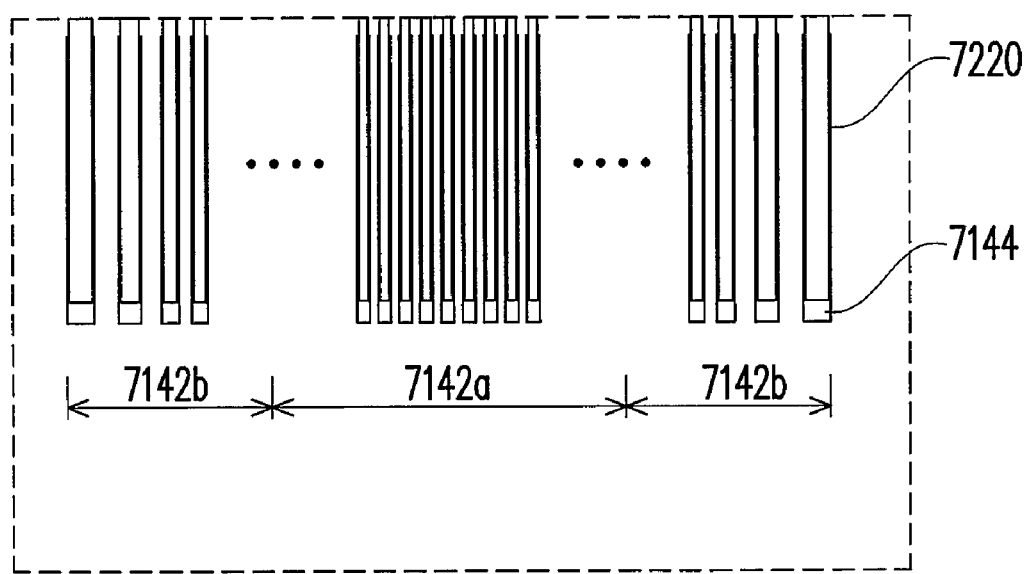
FIG. 7 is a schematic view of a display panel according to a sixth embodiment of the present invention.

The present embodiment is approximately identical to the fourth and the fifth embodiments, and same or similar reference numbers used in the present embodiment and in the fourth and the fifth embodiments represent the same or the like elements. Accordingly, no further description thereof is provided hereinafter. FIG. 7 is a schematic view depicting a bonding of first pins of a substrate to second pins of driving chips in a display panel according to a sixth embodiment of the present invention. Referring to FIG. 7, the difference between the present embodiment and the fourth and the fifth embodiments lies in that both a width of each of the first pins 7144 in expansion regions 7142b and a pin pitch between the two adjacent first pins 7144 may vary with different positions where the first pins 7144 are disposed relative to a non expansion region 7142a.

More particularly, as the first pins 7144 are relatively disposed in a farther distance from the non expansion region 7142a, the width of each of the first pins 7144 in the expansion regions 7142b is increased. Further, as the first pins 7144 are relatively disposed in a farther distance from the non expansion region 7142a, the pin pitch between the two adjacent first pins 7144 in the expansion regions 7142b is increased.

Thus, as second pins 7220 are electrically connected to the first pins 7144 through performing a thermal compression process, the imperfect bonding which is caused by a thermal expansion and occurs between the first pins 7144 and the second pins 7220 can be improved after a thermal compression process is performed, increasing the bonding rate of the first pins 7144 to the second pins 7220.

In comparison with the related art, the high bonding rate of the first pins 7144 to the second pins 7220 in the present embodiment leads to a saving in reworking material costs arisen from the imperfect bonding of the first pins 7144 to the second pins 7220, and rework labor hours can also be reduced, simultaneously increasing yield of the display panel (not shown).

Besides, the display panel of the present embodiment has a higher bonding rate than the display panels provided by the fourth and the fifth embodiments.

Seventh Embodiment

Figure 8:
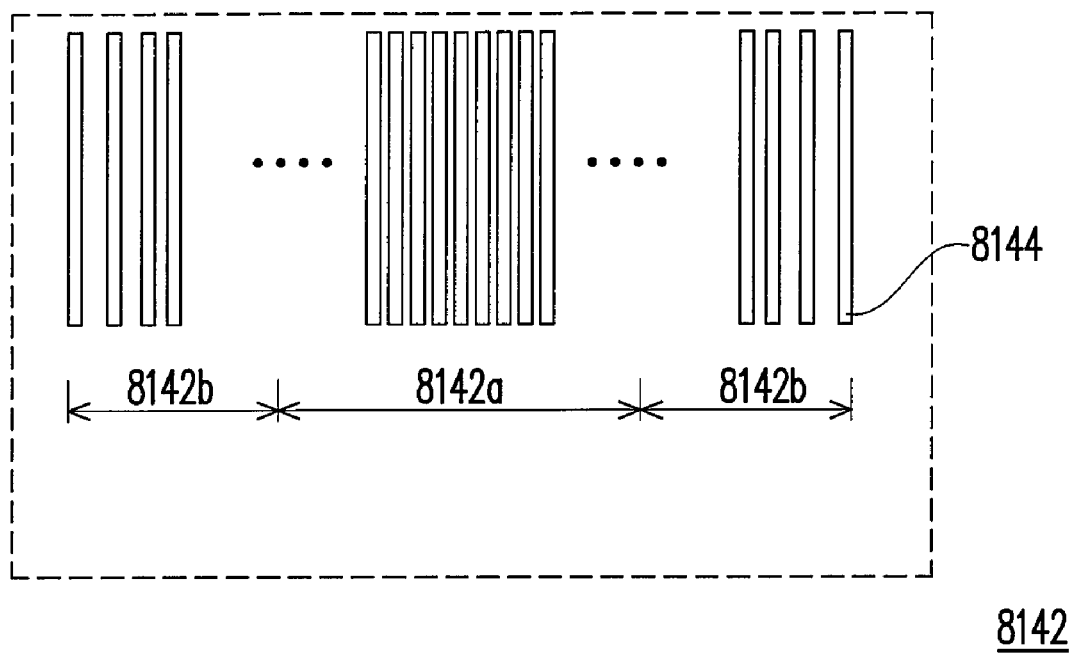
FIG. 8 is a schematic view of a display panel according to a seventh embodiment of the present invention.

The present embodiment is approximately identical to the fourth the fifth and the sixth embodiments, and same or similar reference numbers used in the present embodiment and in the fourth, the fifth and the sixth embodiments represent the same or the like elements. Accordingly, no further description thereof is provided hereinafter. FIG. 8 is a schematic view of a display panel according to a seventh embodiment of the present invention. Referring to FIG. 8, the difference between the present embodiment and the fourth, the fifth and the sixth embodiments lies in that a width of each of the first pins 8144 in a non expansion region 8142a is the same, while a pin pitch between the two adjacent first pins 8144 in expansion regions 8142b may vary with different positions where the first pins 8144 are disposed relative to the non expansion region 8142a.

More particularly, as the first pins 8144 are relatively disposed in a farther distance from the non expansion region 8142a, the pin pitch between the two adjacent first pins 8144 in the expansion regions 8142b is increased.

Eighth Embodiment

Figure 9:
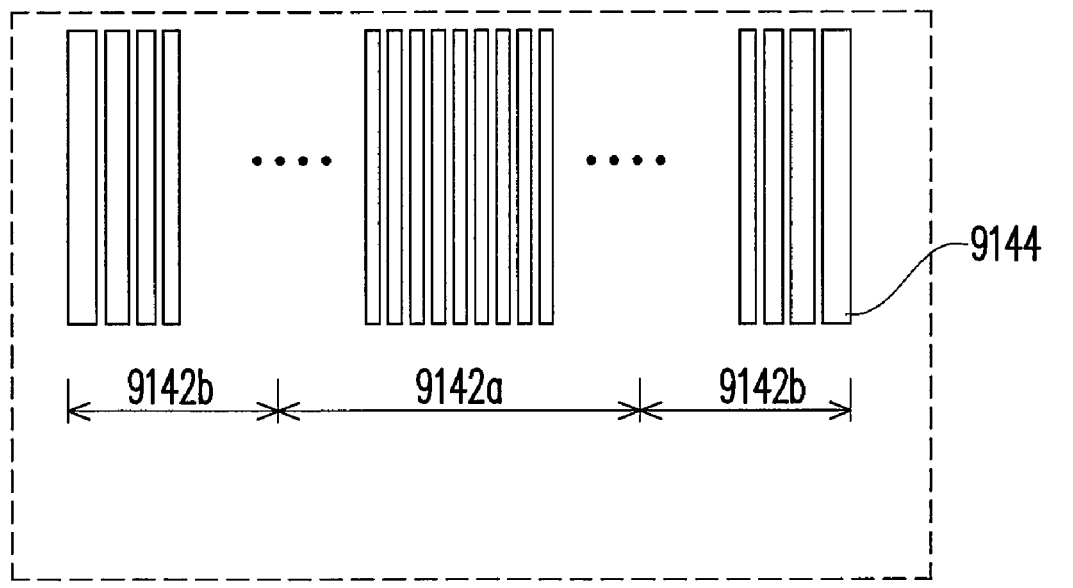
FIG. 9 is a schematic view of a display panel according to an eighth embodiment of the present invention.

The present embodiment is approximately identical to the seventh embodiment, and same or similar reference numbers used in the present embodiment and in the seventh embodiment represent the same or the like elements. Accordingly, no further description thereof is provided hereinafter. FIG. 9 is a schematic view of a display panel according to an eighth embodiment of the present invention. Referring to FIG. 9, the difference between the present embodiment and the seventh embodiment lies in that a width of each of the first pins 9144 in expansion regions 9142b may vary with different positions where the first pins 9144 are disposed relative to a non expansion region 9142a.

More particularly, as the first pins 9144 are relatively disposed in a farther distance from the non expansion region 9142a, the width of each of the first pins 9144 in the expansion regions 9142b is increased.

Ninth Embodiment

Figure 10:
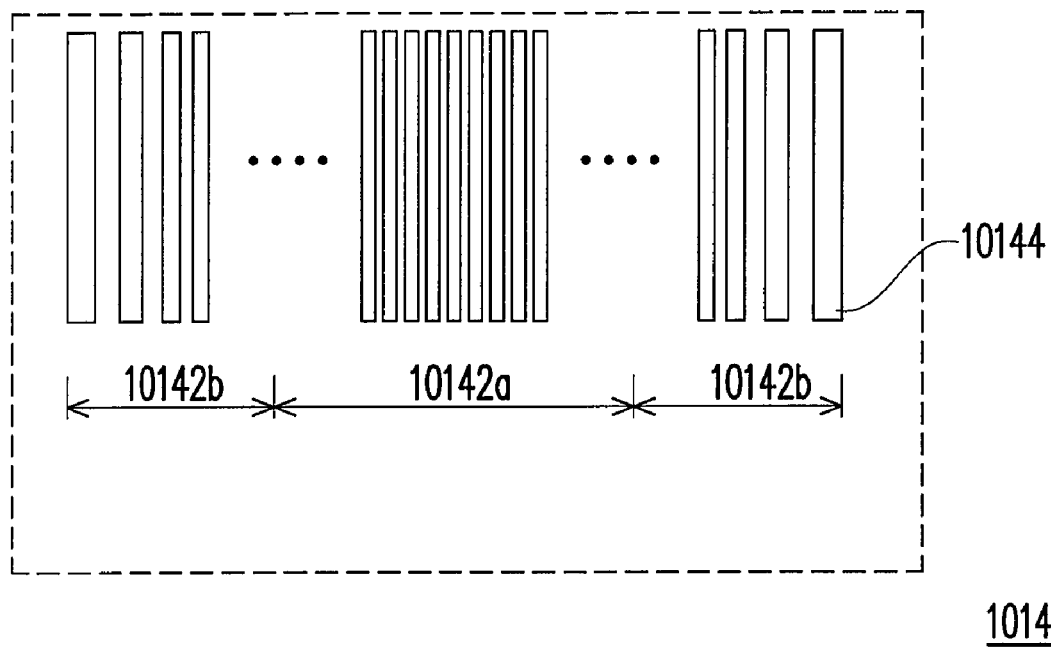
FIG. 10 is a schematic view of a display panel according to a ninth embodiment of the present invention.

In the present embodiment, the seventh and the eighth embodiments are both applied. People skilled in the art can easily combine and apply said embodiments, and thus further descriptions are briefly provided hereinafter. FIG. 10 is a schematic view of a display panel according to a ninth embodiment of the present invention. As shown in FIG. 10, in the present embodiment, both a width of each of the first pins 10144 in a expansion regions 10142b and a pin pitch between the two adjacent first pins 10144 may vary with different positions where the first pins 10144 are disposed relative to a non expansion region 10142a.

More particularly, as the first pins 10144 are relatively disposed in a farther distance from the non expansion region 10142a, the width of each of the first pins 10144 in the expansion regions 10142b is increased. Further, as the first pins 10144 are relatively disposed in a farther distance from the non expansion region 10142a, the pin pitch between the two adjacent first pins 10144 in the expansion regions 10142b is increased.

Tenth Embodiment

Figure 11:
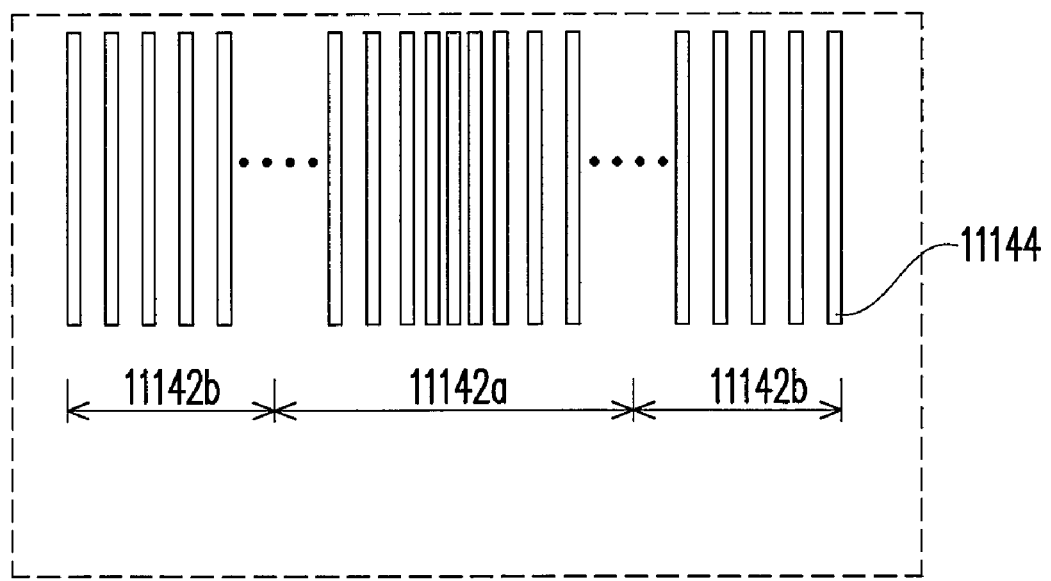
FIG. 11 is a schematic view of a display panel according to a tenth embodiment of the present invention.

The present embodiment is approximately identical to the seventh embodiment, and same or similar reference numbers used in the present embodiment and in the seventh embodiment represent the same or the like elements. Accordingly, no further description thereof is provided hereinafter. FIG. 11 is a schematic view depicting a bonding of first pins of a substrate to second pins of driving chips in a display panel according to a tenth embodiment of the present invention. Referring to FIG. 11, the difference between the present embodiment and the seventh embodiment lies in that each pin pitch between the two adjacent first pins 11144 in expansion regions 11142b is the same, while a width of each of the first pins 11144 in a non expansion region 11142a may vary with different positions where the first pins 11144 are disposed relative to the expansion regions 11142b.

More particularly, as the first pins 11144 are relatively disposed in a farther distance from the expansion regions 11142b, the pin pitch between the two adjacent first pins 11144 in the non expansion region 11142a is increased.

Eleventh Embodiment

Figure 12:
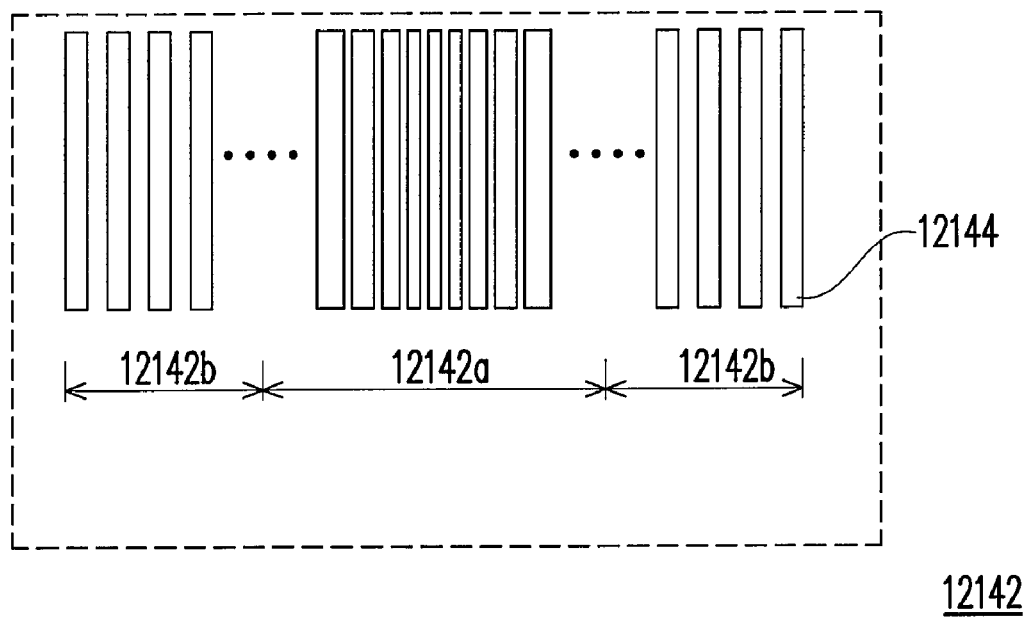
FIG. 12 is a schematic view of a display panel according to an eleventh embodiment of the present invention.

The present embodiment is approximately identical to the tenth embodiment, and same or similar reference numbers used in the present embodiment and in the tenth embodiment represent the same or the like elements. Accordingly, no further description thereof is provided hereinafter. FIG. 12 is a schematic view of a display panel according to an eleventh embodiment of the present invention. Referring to FIG. 12, the difference between the present embodiment and the tenth embodiment lies in that a width of each of the first pins 12144 in a non expansion region 12142a may vary with different positions where the first pins 12144 are disposed relative to expansion regions 12142b.

More particularly, as the first pins 12144 are relatively disposed in a farther distance from the expansion regions 12142b, the width of each of the first pins 12144 in the non expansion region 12142a is increased.

Twelfth Embodiment

Figure 13:
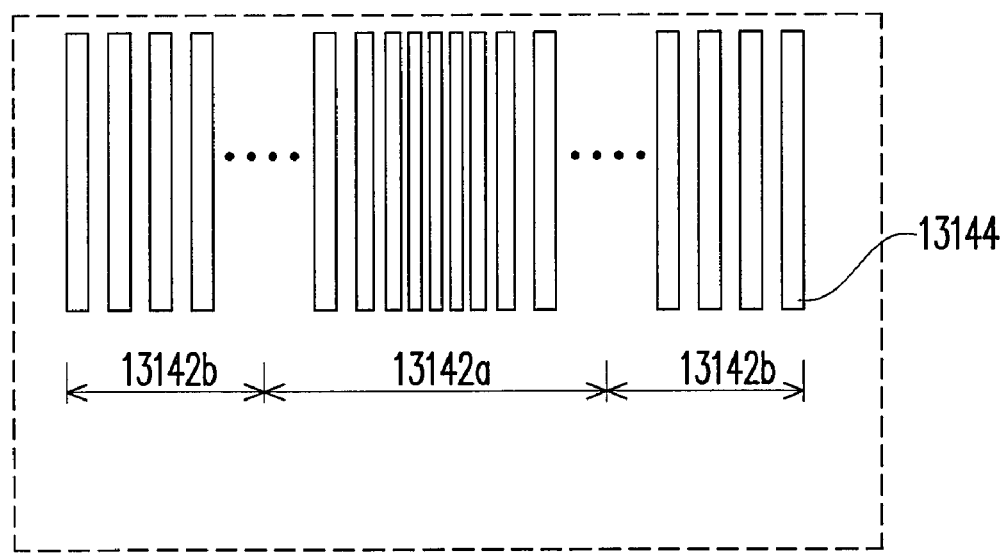
FIG. 13 is a schematic view of a display panel according to a twelfth embodiment of the present invention.

In the present embodiment, the tenth and the eleventh embodiments are both applied. People skilled in the art can easily combine and apply said embodiments, and thus further descriptions are briefly provided hereinafter. FIG. 13 is a schematic view of a display panel according to a twelfth embodiment of the present invention. As shown in FIG. 13, in the present embodiment, both a width of each of the first pins 13144 in a non expansion region 13142a and a pin pitch between the two adjacent first pins 13144 may vary with different positions where the first pins 13144 are disposed relative to expansion regions 13142b.

More particularly, as the first pins 13144 are relatively disposed in a farther distance from the expansion regions 13142b, the width of each of the first pins 13144 in the non expansion region 13142a is increased. Further, as the first pins 13144 are relatively disposed in a farther distance from the expansion regions 13142b, the pin pitch between the two adjacent first pins 13144 in the non expansion region 13142a is increased.

Thirteenth Embodiment

Figure 14:
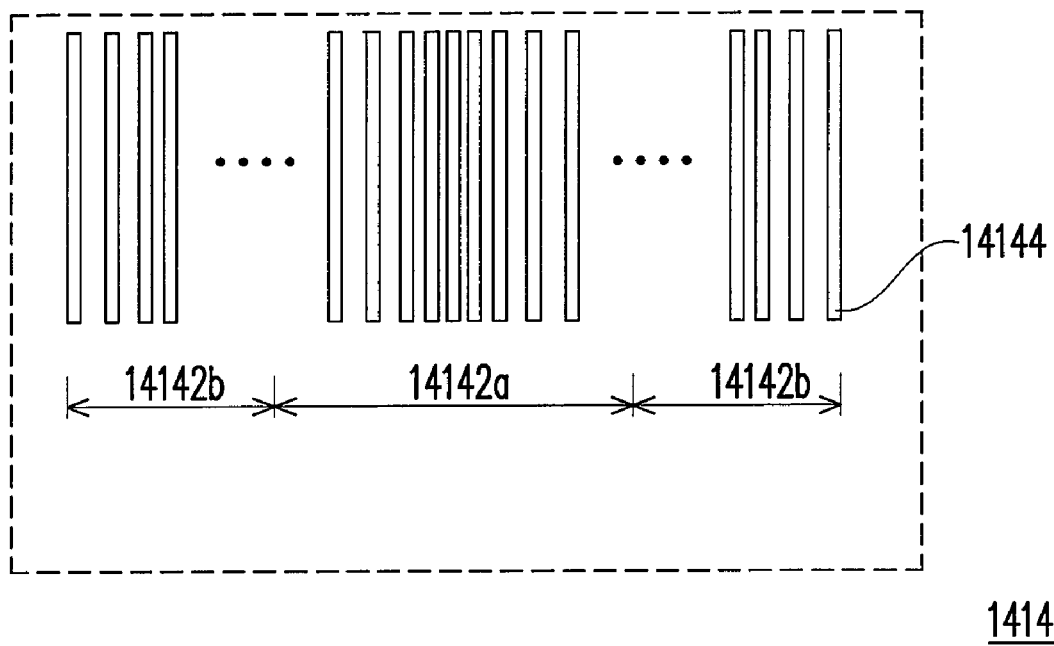
FIG. 14 is a schematic view of a display panel according to a thirteenth embodiment of the present invention.

The present embodiment is approximately identical to the tenth embodiment, and same or similar reference numbers used in the present embodiment and in the tenth embodiment represent the same or the like elements. Accordingly, no further description thereof is provided hereinafter. FIG. 14 is a schematic view of a display panel according to a thirteenth embodiment of the present invention. Referring to FIG. 14, the difference between the present embodiment and the tenth embodiment lies in that a width of each of the first pins 14144 in expansion regions 14142b is the same, while a pin pitch between the two adjacent first pins 14144 may vary with the positions where the first pins 14144 are disposed relative to a non expansion region 14142a. Further, the pin pitch between the two adjacent first pins 14144 in the non expansion region 14142a may vary with the positions where the first pins 14144 are disposed relative to the expansion regions 14142b.

More particularly, as the first pins 14144 are relatively disposed in a farther distance from the expansion regions 14142b, the pin pitch between the two adjacent first pins 14144 in the non expansion region 14142a is increased.

Fourteenth Embodiment

Figure 15:
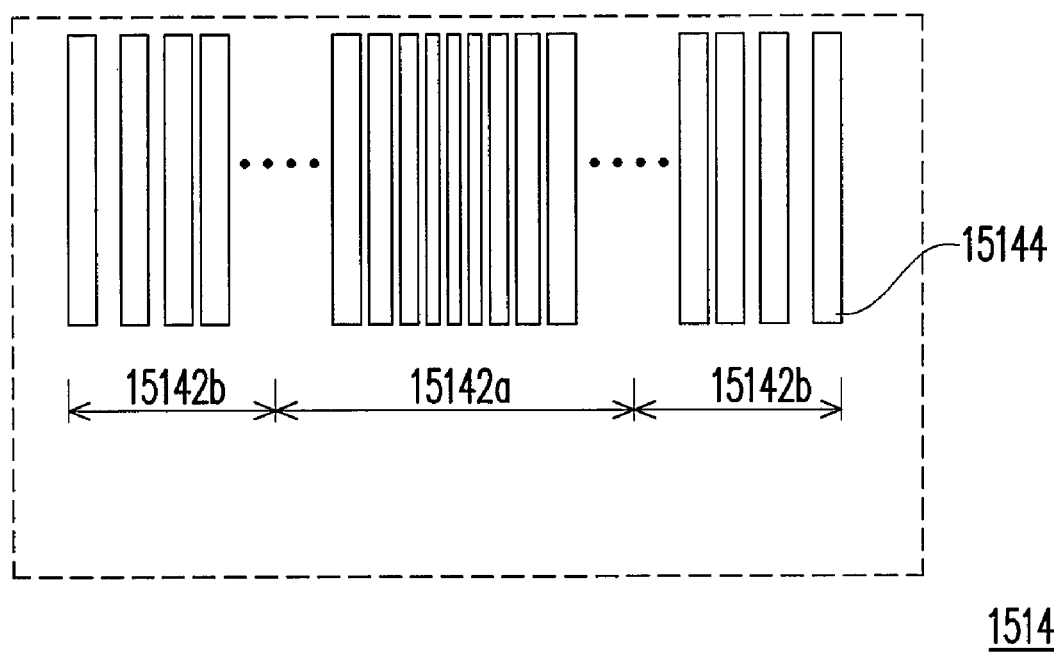
FIG. 15 is a schematic view of a display panel according to a fourteenth embodiment of the present invention.

The present embodiment is approximately identical to the thirteenth embodiment, and same or similar reference numbers used in the present embodiment and in the thirteenth embodiment represent the same or the like elements. Accordingly, no further description thereof is provided hereinafter. FIG. 15 is a schematic view of a display panel according to a fourteenth embodiment of the present invention. Referring to FIG. 15, the difference between the present embodiment and the thirteenth embodiment lies in that a width of each of the first pins 15144 in a non expansion region 15142a may vary with different positions where the first pins 15144 are disposed relative to expansion regions 15142b.

More particularly, as the first pins 15144 are relatively disposed in a farther distance from the expansion regions 15142b, the width of each of the first pins 15144 in the non expansion region 15142a is increased.

Fifteenth Embodiment

Figure 16:
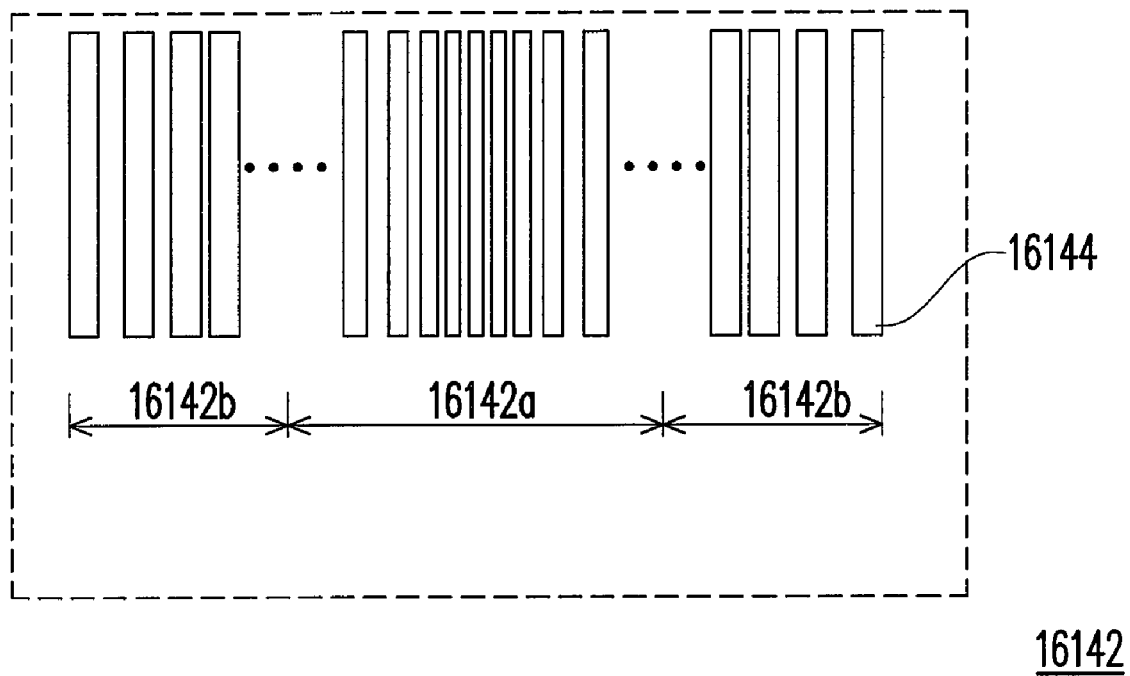
FIG. 16 is a schematic view of a display panel according to a fifteenth embodiment of the present invention.

In the present embodiment, the thirteenth and the fourteenth embodiments are both applied. People skilled in the art can easily combine and apply said embodiments, and thus further descriptions are briefly provided hereinafter. FIG. 16 is a schematic view depicting a bonding of first pins of a substrate to second pins of driving chips in a display panel according to a fifteenth embodiment of the present invention. As shown in FIG. 16, in the present embodiment, both a width of each of the first pins 16144 in a non expansion region 16142a and a pin pitch between the two adjacent first pins 16144 may vary with different positions where the first pins 16144 are disposed relative to expansion regions 16142b.

More particularly, as the first pins 16144 are relatively disposed in a farther distance from the expansion regions 16142b, the width of each of the first pins 16144 in the non expansion region 16142a is increased. Further, as the first pins 16144 are relatively disposed in a farther distance from the expansion regions 16142b, the pin pitch between the two adjacent first pins 16144 in the non expansion region 16142a is increased.

All of the above fifteen embodiments take an increasing width of the first pins or an increasing pin pitch between the two adjacent first pins for example. However, it should be noted that people skilled in the art are able to easily combine, change and apply said embodiments and it will still be considered within the spirit of the present invention after the claims and the embodiments of the present invention are studied.

Based on the above, in the display panel of the present invention, the width of each of the first pins of the substrate and the pin pitch between the two first pins may vary with different positions at which the first pins are disposed in one of the pad regions. Therefore, when the second pins of the driving chips are bonded to the first pins through performing the thermal compression process, the second pins and the first pins can still be accurately bonded to each other in spite of the thermal expansion. In comparison with the related art, the display panel provided by the present invention has a higher bonding rate.

Furthermore, as the bonding rate of the pins in the display panel is increased, yield of the display panel is improved as well. Simultaneously, the reworking material costs can be saved, and the rework labor hours and costs are further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, comprising:
    a substrate having a plurality of pad regions located in a non-display region of the substrate, wherein a plurality of first pins with the same length is disposed in each of the pad regions, and a pin pitch between the two adjacent first pins, a width of each of the first pins, or both said pin pitch and said width vary with the positions where the first pins are disposed in a corresponding pad region,
    said pin pitch is calculated according to an effective equation $Y=(Y2-Y1)*(X/X1)^n+Y1$, wherein Y is pin pitch, Y2 is an $N_{th}$ pin pitch, Y1 is a first pin pitch, X is the first pin of the pins, and X1 is a $X1_{th}$ pin of the pins; and
    a plurality of driving chips disposed in the non-display region of the substrate, wherein each of the driving chips has a plurality of second pins, and each second pin is electrically connected to each first pin.

2. The display panel of claim 1, wherein each of the pad regions has a center line, and the first pins in the pad region are symmetrically arranged with respect to the center line.

3. The display panel of claim 2, wherein the pin pitch between the two adjacent first pins in each of the pad regions is increased in a direction away from the center line.

4. The display panel of claim 2, wherein the width of each of the first pins in each of the pad regions is increased in the direction away from the center line.

5. The display panel of claim 1, wherein the substrate is an active device array substrate.

* * * * *